United States Patent [19]

Prince

[11] 4,232,279

[45] Nov. 4, 1980

[54] LOW NOISE CHARGE COUPLED DEVICE TRANSVERSAL FILTER

[75] Inventor: Paul R. Prince, Manhattan Beach, Calif.

[73] Assignee: Hughes Aircraft Company, Culver City, Calif.

[21] Appl. No.: 960,903

[22] Filed: Nov. 15, 1978

Related U.S. Application Data

[63] Continuation of Ser. No. 759,297, Jan. 14, 1977, abandoned, which is a continuation of Ser. No. 597,731, Jul. 21, 1975, abandoned.

[51] Int. Cl.² ............... H03H 7/28; G11C 19/28; H03K 5/156; H01L 29/78
[52] U.S. Cl. ............... 333/165; 307/221 D; 333/166; 357/24
[58] Field of Search ............... 333/165, 166; 357/24; 307/221 R, 221 C, 221 D; 364/862

[56] References Cited

U.S. PATENT DOCUMENTS

| | | | |
|---|---|---|---|
| 3,474,260 | 10/1969 | Frohbach | 307/221 R |
| 3,819,958 | 6/1974 | Gosney | 333/165 X |
| 3,877,056 | 4/1975 | Bailey | 307/221 D |
| 3,999,152 | 12/1976 | Sato et al. | 333/165 |

OTHER PUBLICATIONS

Sangster–"The Bucket Brigade Delay Line, A Shift Register For Analogue Signals" in Philips Technical Review vol. 37, 1970, No. 4., pp. 97–110.
Buss et al.,–"Transversal Filtering Using Charge Transfer Devices" in IEEE Journal of Solid'–State Circuits, vol. SC-8, No. 2, Apr. 1973; pp. 138–146.
MacLennan–"Signal Processing", Wireless World, Feb. 1975; pp. 61–65.
Ibraham et al.,–"CCD's For Transversal Filter Applications," IEEE IEDM, Washington, D.C. Dec. 1974; pp. 240–243.
Collins et al.,–"Analog Matched Filters Using Charge Coupled Devices," IEEE Nerem 72 Record, Boston, Mass. Oct. 30–Nov. 3, 1972; pp. 155–157.

*Primary Examiner*—Marvin L. Nussbaum
*Attorney, Agent, or Firm*—Robert M. Wallace; W. H. MacAllister; W. J. Adam

[57] ABSTRACT

A charge coupled device (CCD) transversal filter (TVF) having an improved electrode configuration and connecting arrangement which minimizes the noise that is added to the signal to provide a relatively high amplitude output signal and a relatively high output signal-to-noise ratio. The CCD transversal filter operates with the weighting coefficients determined by the one sided width of the electrodes and with one end of the split electrodes coupled to the output and the other ends of the split electrodes coupled to a reference voltage source. When some of the weighting coefficients of the desired impulse response are negative the output ends of the weighting electrodes are selectively connected to either the inverting or noninverting common connections of a differential amplifier in turn providing the transversal filter output signals. For a single polarity impulse response, all of the electrodes are coupled to an output arrangement without requiring an inversion. In the one sided transversal filter of the invention the net output signal in terms of charge is the same as for a conventional two-sided transversal filter but the electrode area contributing noise is substantially less than in the conventional two-sided arrangement. As the noise charge generated within a bucket is transferred down the channel, it becomes coherent from side to side and the charge added to the signal and sensed on the following electrodes is not reduced in the system of the invention. Because the total electrode capacitance is a function of total electrode area the system provides a significant increase in voltage swing at the output and has a further advantage that the effect of the input noise of the output differential amplifier is also significantly reduced because of the relatively large signal.

14 Claims, 12 Drawing Figures

LOW NOISE CHARGE COUPLED DEVICE TRANSVERSAL FILTER

RELATED APPLICATIONS

This application is a continuation of application Ser. No. 759,297 filed Jan. 14, 1977, now abandoned, which is a continuation of application Ser. No. 597,731 filed July 21, 1975, now abandoned, all entitled LOW NOISE CHARGE COUPLED DEVICE TRANSVERSAL FILTER. Application Ser. No. 737,114 filed Oct. 29, 1976 entitled CTD CHARGE SUBTRACTION TRANSVERSAL FILTER discloses related subject matter. The above-identified applications are by Paul R. Prince.

BACKGROUND OF THE INVENTION

1. Field of the Invention

This invention relates to transversal filter systems and particularly to a one-sided charge coupled transversal filter that operates with a substantially high signal-to-noise ratio.

2. Description of the Prior Art

As is well known in the art, charge coupled device transversal filters provide signal filtering of analog signals using time sampling techniques common to CCD technology. The conventional charge coupled device transversal filter is a two-sided arrangement in which the electrodes are split into an upper and lower portion in a configuration to provide the weighting coefficients with the signals from the upper and lower electrodes being applied to a differential amplifier for developing the transversal filter output. The input signal to be filtered is sampled at at least a rate greater than twice the highest frequency of interest in the signal. This sampling stage is then followed by N delay stages each of which delays a signal sample for one clock period. At each delay stage a signal is nondestructively sampled, multiplied by a predetermined weighting coefficient as a result of the difference in the electrodes widths and the weighted samples are summed to give the filter output $V_0$. Thus, by splitting alternate buried metal CCD electrodes so that the difference in length of each electrode represents the corresponding weighting coefficient and sensing the displacement current sums in the upper and lower portions, the desired impulse response is provided by the filter. In the conventional two-sided transversal filter noise is generated within the CCD channel, at the reset gate and in the output devices. Noise being generally a limiting parameter in electronic and electro optical systems, a relatively low signal-to-noise ratio substantially degrades overall system performance. Because the capacitance is proportional to electrode area, the conventional two-sided transversal filter has its limitations because of the noise sources in the filter system. It would be of substantial advantage to the art, if a CCD transversal filter were provided that would develop a minimum of noise and that would provide a substantially high output voltage swing.

SUMMARY OF THE INVENTION

The one-sided transversal filter of the invention effectively operates as a charge coupled device (CCD) with floating gates to provide filtering of input signals with a desired impulse response by having split electrodes with one end coupled to a reference voltage source and the other end of the electrodes coupled to the output circuits. The weighting coefficients for any selected impulse response are a function of the length of only one portion of each split electrode and the electrode area contributory noise to the output signal is substantially reduced from that of the prior art configuration. When some of the weighting parameters provided by the one-sided filter are negative, depending on the desired impulse response, the active electrodes are connected to either the inverting or noninverting common connections of a differential amplifier. Thus, in the filter of the invention the noise generated in each bit position is substantially reduced by the one-sided arrangement and because of the reduction of area and of capacitance, the output voltage swing is considerably increased and the reset noise is considerably reduced over the prior art. Furthermore, the common mode signal is eliminated allowing the utilization of a simplified differential amplifier.

It is therefore an object of this invention to provide an improved charge coupled device transversal filter that operates at a substantially low noise level.

It is a further object of this invention to provide an improved CCD transversal filter in which a substantial portion of the noise of a conventional CCD transversal filter is eliminated.

It is another object of this invention to provide a CCD transversal filter having a substantially large output voltage swing.

It is still another object of this invention to provide an improved transversal filter than operates satisfactorily with a differential amplifier having a relatively small common mode rejection requirement.

It is a still further object of this invention to provide an improved CCD transversal filter that will develop impulse responses selected to have either one or two polarities.

It is a further object of this invention to provide an output sample and holding technique to substantially eliminate clock pickup at the output and thereby reduce the bandwidth requirements of the differential amplifier.

BRIEF DESCRIPTION OF THE DRAWINGS

These and other objects, features and advantages of the invention itself, will become apparent to those skilled in the art in the light of the following detailed description taken in consideration with accompanying drawings, wherein like reference numerals indicate like corresponding parts throughout the several parts wherein.

DETAILED DESCRIPTION OF THE INVENTION

Figure 1:
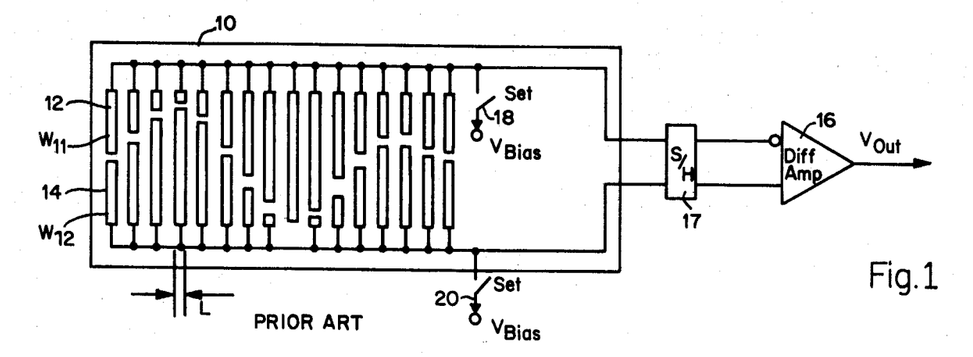
FIG. 1 is a schematic diagram of a conventional two-sided CCD transversal filter for briefly explaining the prior art.

Referring first to FIG. 1 which shows the conventional electrode structure for implementing a transversal filter, the system includes a substrate 10 on or in which is positioned a plurality of electrode structures such as 12 and 14 shown as split electrodes to provide a weighting parameter equal to the difference in length $W_{11}$ and $W_{12}$. Each split electrode has a dimension along the CCD shown as being equal to L. It is to be noted that each split electrode structure such as 12 and 14 has associated therewith three other electrodes for implementing the transfer of the charge from one split electrode to the other. A differential amplifier 16 receives the signal from the two halves of the plurality of split electrodes after passing through a sample and hold circuit 17 to provide an output voltage equal to the difference in charge value in the two halves of all of the split electrodes. For setting the potentials at the proper time, set switches 18 and 20 coupled to a proper bias voltage establish a reference voltage value on all of the split electrodes. The output set noise is approximately proportional to $\sqrt{C_T}$ where $C_T$ is the total capacitance of the two portions of the split electrodes that are set. The fast interface state noise voltage generated within a k th bucket is approximately proportional to $\sqrt{A_k}$ where $A_k$ is the electrode area. Leakage noise and thermal noise are (for buried channel CCDs) also approximately proportional to $\sqrt{A_k}$. Thus, all significant noise sources excluding input and output device noise sources are proportional to the square root of the total electrode structure area $(W_{11}+W_{12}) \times L$, that is connected to the output differential amplifier or source follower pair or sample and hold circuit. A correlation effect will occur making the contribution to the output from the noise generated within the k th bucket proportional to the difference in areas of succeeding electrodes connected to the inverting and noninverting differential amplifier inputs. The system of this invention does not decrease this noise term, which is neglected below.

For a conventional CCD transversal filter as represented in FIG. 1;

if n=noise power generated per unit area under an electrode.

M=total number of electrodes.
$W_{k1}$=width of k th electrode upper.
$W_{k2}$=width of k th electrode lower.
L=electrode length.
$h_k$=k th weighting coefficient of desired impulse response.
$N_k$=noise power picked up by k th electrode, both sides total.
N=noise power, total.

Then $N = \sum_{k=1}^{M} nLW_{k1} + nLW_{k2} = nL \sum_{k=1}^{M} (W_{k1} + W_{k2})$;

but $W_{k1} + W_{k2} = W_k$ = total CCD channel width therefore $N = nL \sum_{k=1}^{M} W_k = nLW_k M = nA$ where
A=total area of all electrodes.
Noise voltage, $V_n = \sqrt{N} = \sqrt{nA}$.

Therefore to reduce noise and not the signal it is required that A be reduced without reducing the signal.

$N_k = W_{k1} + W_{k2}$ but the signal is proportional to $W_{k1} - W_{k2}$.

Thus the S/N ratio from the k th electrode = $\dfrac{W_{k1} - W_{k2}}{(W_{k1} + W_{k2})^{\frac{1}{2}}}$ In accordance with the invention the signal to noise ratio can be maximized by providing $W_{k2}=0$. This improvement of the signal-to-noise ratio is accomplished in accordance with the invention by making $W_{k1}=h_k$ and providing $W_{k3}$ which is connected to a bias supply but not connected to the output amplifier. For providing an impulse response in which some of the weighting coefficients $h_k$ are negative, $W_{k1}$ must be connected to either the inverting or the noninverting common connections of the differential amplifier.

Figure 2:
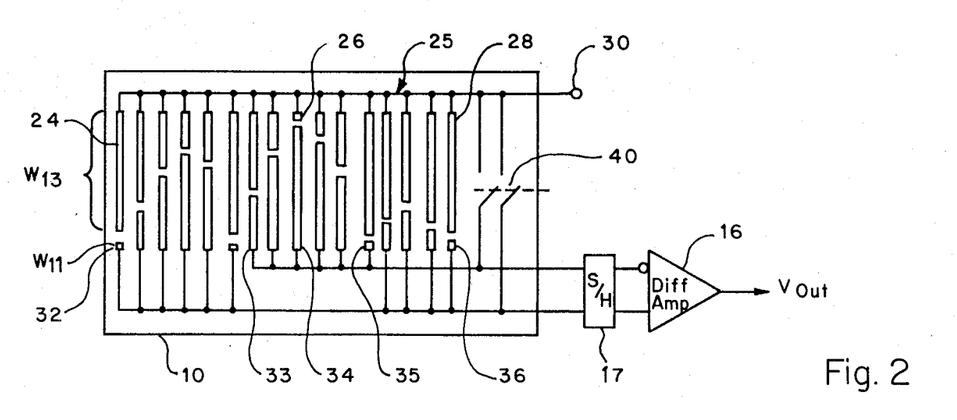
FIG. 2 is a schematic diagram of a one-sided low noise CCD transversal filter in accordance with the principles of the invention to develop an impulse response having weighting coefficients of both positive and negative polarities.
Figure 3:
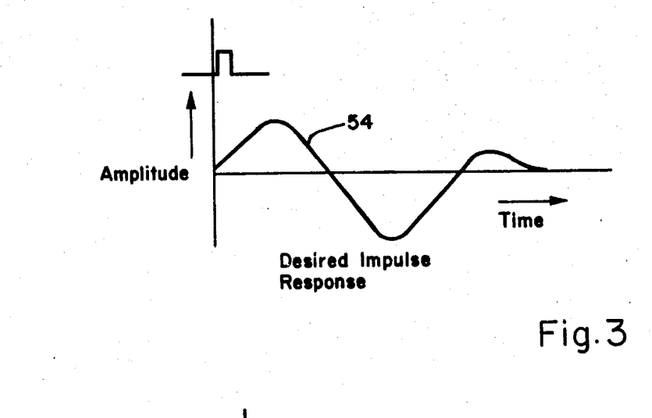
FIG. 3 is a schematic diagram of waveforms showing the impulse response for the transversal filters of FIGS. 1 and 2.

Referring now principally to FIG. 2 which shows a one-sided electrode structure in accordance with the invention, upper split electrode portions such as 24, 26 and 28 are coupled to a voltage bias source 30 and lower split electrode portions such as 32, 34 and 36 are coupled to the optional sample and hold circuit 17 and in turn the input terminals of the differential amplifier 16. It is again to be noted that each of the split electrodes has associated therewith three additional electrodes required for the transfer of the charge. The six electrodes starting with electrode portion 32 and the five electrodes starting with electrode portion 35 are coupled to the positive terminal of the differential amplifier 16 and the six electrodes starting with the electrode portion 33 are coupled to the inverting or negative terminal of the differential amplifier 16. Set switches 40 are provided to apply a voltage $V_{bias}$ to the active side of the split electrodes to develop a reference voltage. Thus the desired signal for a two polarity impulse response is obtained by inverting in the gap configuration the portion of the impulse response having a second polarity and utilizing only the signal from the net difference desired by connecting the output differential circuit to appropriate electrodes. In the system of FIG. 2 the electrode area contributing noise may be substantially less than in the conventional arrangement of FIG. 1 but the output signal has been found to be substantially increased because of the decrease of the electrode capacitance. As can be seen in FIG. 3 the impulse response of a curve 54, being the illustrative impulse response provided by the CCD filter of both FIGS. 1 and 2 with a sample and hold circuit, is developed in response to a pulse of a waveform 55 applied to the input of the transversal filter of either FIG. 1 or FIG. 2, which input is not shown. The noise improvement in accordance with the invention is approximately equal to the square root of the quantity of the area of the top electrodes over the area of the lower electrodes in FIG. 2. It is to be noted that the transversal filter characteristic is defined by the impulse response but in operation the filter responds to a signal from a source such as may be provided in an IR, radar or laser system, for example. It is to be noted that the impulse response of FIG. 3 defines a zero DC response filter when the electrode area under the positive and negative portions are equal which provides a high pass, band pass, or complex multi-band pass filter characteristics. For a zero DC response the frequency response approaches zero amplitude as the frequency approaches zero. Relative to two polarity filters the invention is not to be limited to a zero DC type filter but includes filters to provide any desired characteristic such as when the positive and negative electrode areas are unequal. Although one arrangement in accordance with the invention has been illustrated as having only three polarity sections of taps (+, −, +), the principles of the invention include utilizing any number of polarity sections combined to develop either one function or to develop a plurality of functions such as by utilizing a plurality of differential amplifiers with a plurality of dual sample and hold circuits.

Figure 4:
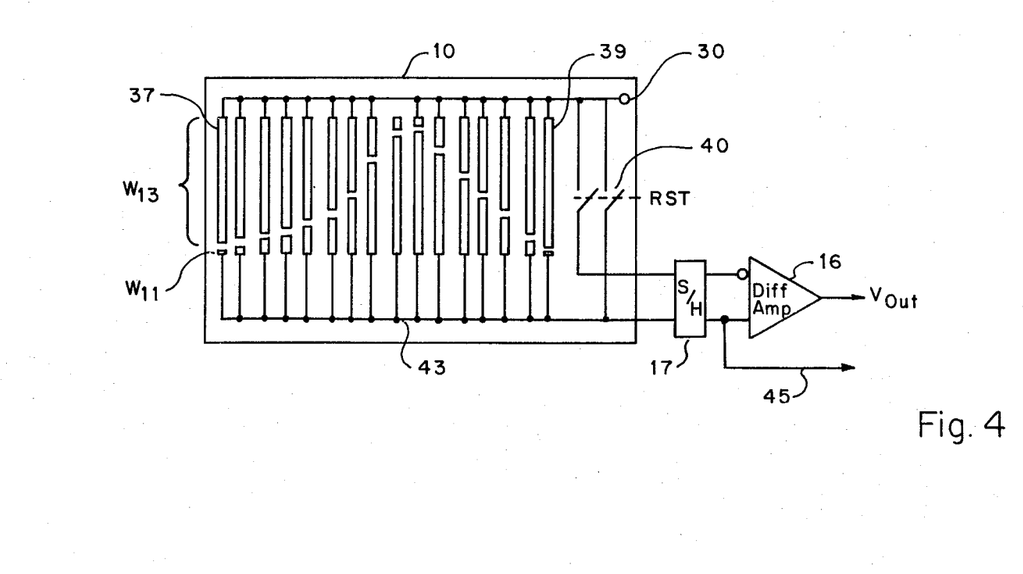
FIG. 4 is a schematic diagram of a one-sided low noise CCD transversal filter in accordance with the invention for developing an impulse response having only one polarity.
Figure 5:
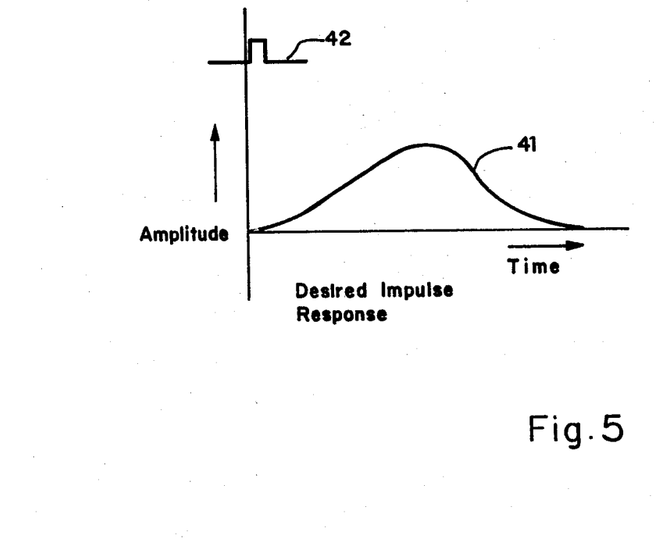
FIG. 5 is a schematic diagram of waveforms showing the single polarity impulse response of the filter of FIG. 4.

Referring now to FIG. 4, a one-sided transversal filter is shown in accordance with the invention for developing an impulse response of a single polarity illustrated as a positive potential relative to an established CCD bias. The gaps of the split electrodes such as 37 and 39 have a configuration of the required weighting coefficients to define the impulse response of a curve 41 of FIG. 5 as provided in response to a pulse of a waveform 42. Because all of the weighting coefficients are positive, the lower end of the electrodes are all coupled to a lead 43 and through the optional sample and hold circuit 17 to one terminal of the differential amplifier 16. The other or upper ends of the electrodes are coupled to the voltage bias terminal 30. In order to improve the operation by cancelling the bias voltage and transients, the reset switches are coupled to both the lead 143 and the other terminal of the differential amplifier 16. It is to be noted that within the scope of the invention the output may be taken on a lead 45 without utilizing the differential amplifier 16 or line 43 without utilizing the sample and hold device 17. The characteristic response of FIG. 4 is a non-DC level average response and may, for example, be utilized as a pulse generator for constructing a pulse with a desired amplitude-time response. However, the single polarity weighting function filter of the invention may be utilized to form any desired characteristic, within the scope of the invention.

Figure 6:
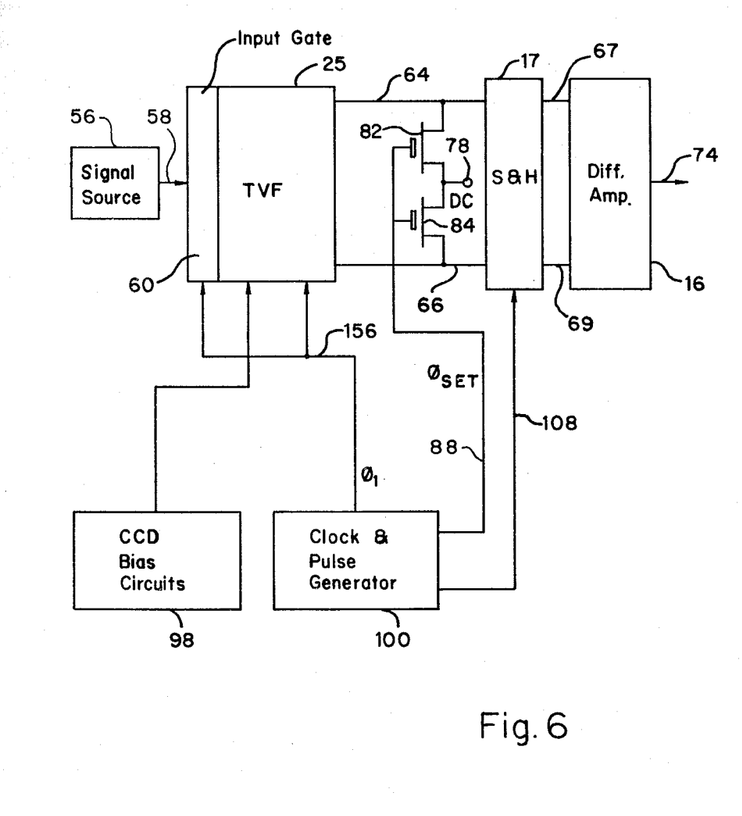
FIG. 6 is a schematic block diagram showing a system utilizing the transversal filter in accordance with the principles of the invention.

Referring now to FIG. 6, the one-sided low noise transversal filter 25 or the one-sided transversal filter of FIG. 4 will be explained in further detail as responding to a signal from a source 56 which may be either a pulse or a signal such as a composite signal to be filtered in the transversal filter. The input signal is applied through a lead 58 to an input gate 60 of the transversal filter 25, in which signal sampling is provided, and thence through the clocked steps of the transversal filter to output leads 64 and 66. The signals on the output leads 64 and 66 which represent the sum of the difference in displacement currents between the split electrodes having either a positive or a negative value, is applied through the optional sample and hold circuit 17 to the differential amplifier 16 and in turn to an output lead 74. With the illustrated single phase CCD operation that may be utilized in accordance with the invention a DC bias source 78 may be clamped through suitable FET transistors 82 and 84 to respective leads 64 and 66 in response to a $\phi_{set}$ timing pulse on a lead 88 to establish a common readout potential level on the split electrodes. A charge coupled device bias circuit 98 may be provided to apply a suitable potential through a lead 138 to the transverse filter 25 and a clock and pulse generator 100 may provide the $\phi_1$ pulse on a lead 156 to the transversal filter as well as to the sample input gates 82 and 84 and provide the $\phi_{set}$ pulse on the lead 88. It is to be noted that the principles of the invention are not limited to coupling the sample and hold circuit prior to the differential amplifier but the sampling and holding operation may be performed after the differential amplifier or not at all, all within the scope of the invention.

Figure 7:
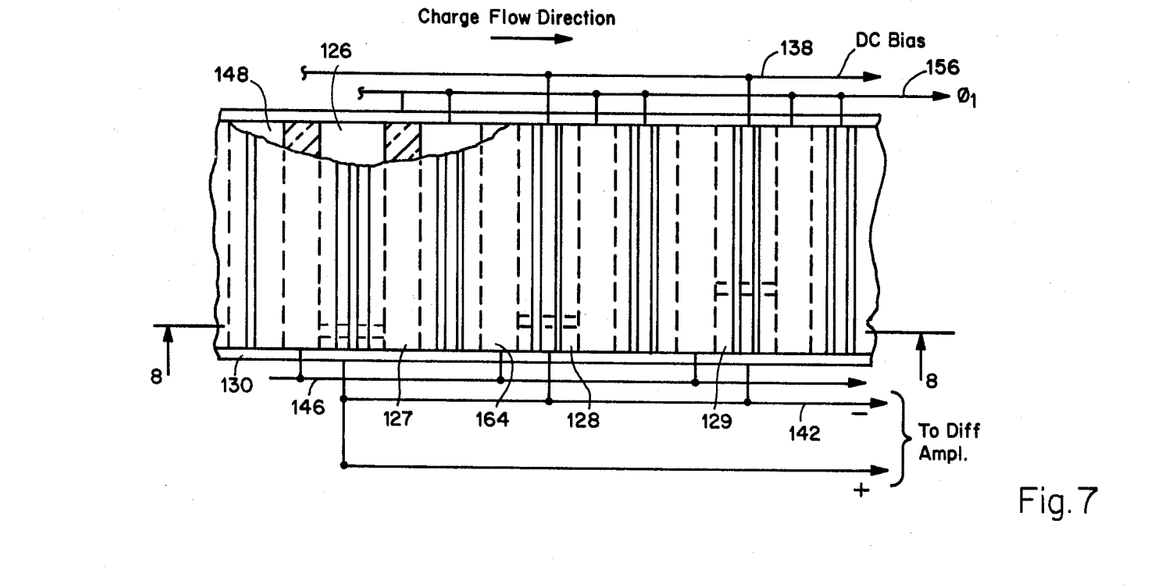
FIG. 7 is a schematic top view illustrating a one-sided transversal filter in accordance with the invention for developing an impulse response having both positive and negative polarities.
Figure 8:
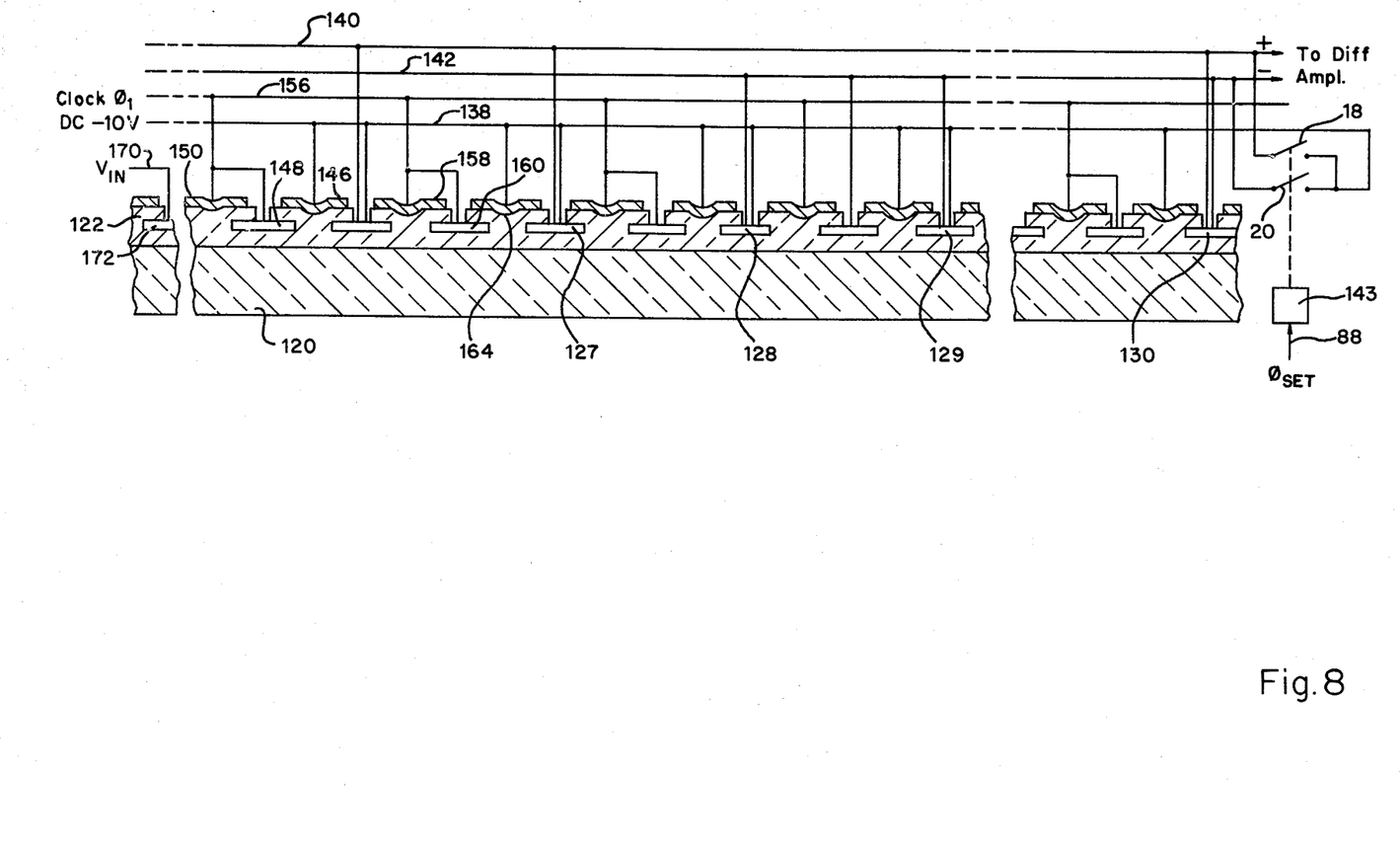
FIG. 8 is a schematic sectional view taken along line 8—8 of FIG. 7 for showing the details of the transversal filter in accordance with the invention.
Figure 9:
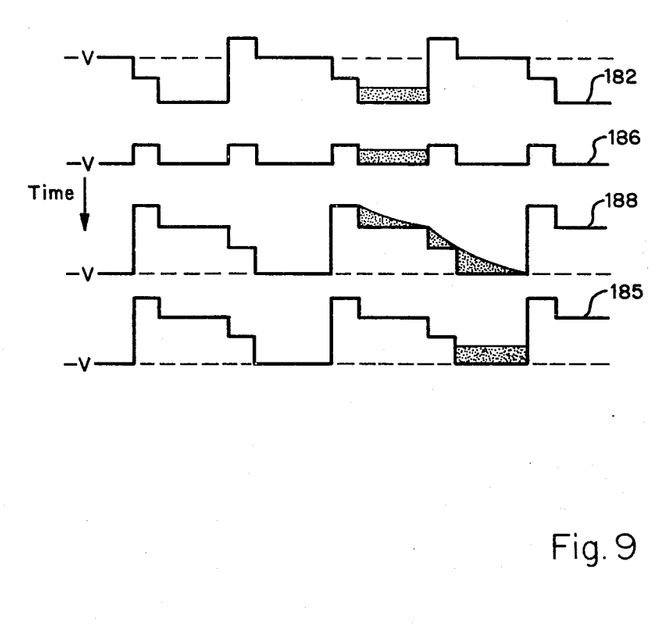
FIG. 9 is a diagram of waveforms of sequentially increasing time for explaining the transfer of the charges between the electrodes of the filter in accordance with the invention.

Referring now to FIG. 7 which is a top view of the charge coupled device transversal filter in accordance with the invention as well as to FIG. 8 which is a sectional view that may be considered taken at lines 8—8 of FIG. 8, the filter may be formed on an n type doped silicon substrate 120 which might have a silicon dioxide insulating layer 122 deposited thereon. Electrodes of a suitable conductive material such as aluminum may be deposited on the surface and buried electrodes of any suitable conductive material such as polysilicon may be positioned and contained in the silicon dioxide layer 122. It is to be noted that the concepts in accordance with the invention are not to be limited to the illustrated fabrication technique, but may include any suitable arrangement such as epitaxial layers or buried channel devices. The transversal filter may include buried split electrodes 126 to 130 having alternate ends thereof coupled to −10 volt DC bias lead 138 and the other or the active end either coupled to positive output lead 140 or a negative output lead 142. Each buried split electrode such as 126 may have three other electrodes such as 146, 148 and 150 associated therewith, the four electrodes forming one clock or step position for the charge transfer. Phase 1 or $\phi_1$ clock pulses on the lead 156 are applied to electrodes 148 and 150 for the group associated with the split electrode 126 and to similar electrodes such as 158 and 160 of the group associated with the split electrode 127. The DC value for the illustrated single phase operation, which value may be −10 volts in order to deplete the substrate under the gate, is applied on the lead 138 to electrode 146 for the group associated with the split electrode 126 and to similar electrodes such as an electrode 164 for the group associated with split electrode 127. The $\phi_{set}$ pulse is applied to a control unit 143 of the switches 18 and 20, illustrative of a suitable switch, to apply the −10 V DC voltage from the lead 138 to both the positive output lead 140 and the negative output lead 142, the proper timing relative to the clock pulse establishing a reference potential in the buried split electrode so that an accurate read out value is provided at sample time. The input voltage $V_{in}$ is applid on a lead 170 to a buried electrode 172 as will be explained subsequently. As can also be seen in FIG. 7 the aluminum electrodes may be deposited on the surface spaced between and overlapping the buried electrodes. Every second buried electrode is a split electrode such as the electrodes 126 and 128 with the DC lead 138 coupled to the surface electrode such as 146 and 164. It may also be coupled to one end of the buried split electrodes such as 126. The ($\phi_1$) clock pulse on the lead 156 is applied to the other two electrode types (one buried and one surface) such as 127 and 166 between buried polysilicon split electrodes such as electrode 126 and the surface metal electrodes preceding the split electrodes such as 146. Each group of four adjacent electrodes such as 146, 126, 127 and 166 thus form a single delay element so that at a time when the clock $\phi_1$ is fully on or about $-20$ volts, the charge has flown to the condition of a waveform 182 as can be seen in FIG. 9. This condition is present during the occurrence of negative pulses and in the absence of a negative pulse on the $\phi_1$ clock line 156, the condition of the waveform 185 occurs. Signal charges are minority carriers as is well known in the art. Upon the rise of the $\phi_1$ pulse on the lead 156 toward 0 volts the charge flows through a transition midpoint condition as shown by a waveform 186 followed by the condition of a waveform 188. Current charges are thus constrained to move only from left to right during each $\phi_1$ clock transition by virtue of the overlapping electrode structure and the resulting electrostatic potential profiles beneath the electrodes. Whenever this charge transfers under an electrode, a displacement current flows in the electrode lead, either in the positive lead 140 or the negative output lead 142. At the next $\phi_1$ clock, the charge of the waveform 185 moves forward to the next potential well to the right.

Figure 10:
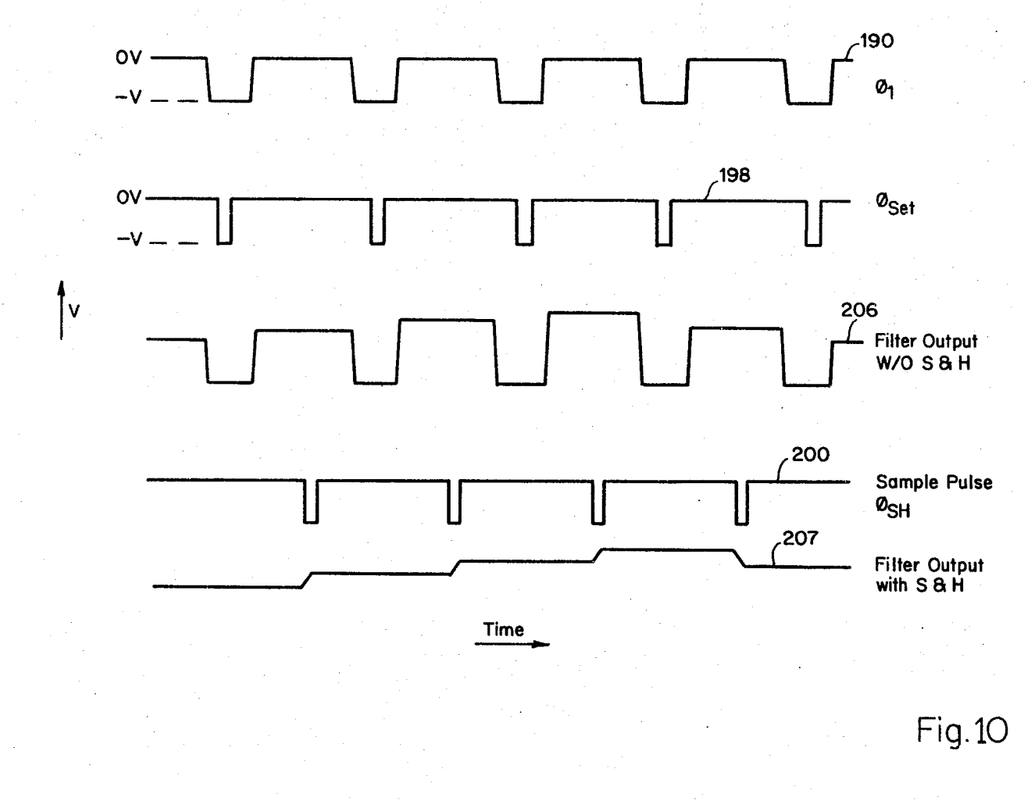
FIG. 10 is a diagram of waveforms showing time as a function of voltage for further explaining the operation of the filter system of FIG. 6.

The $\phi_{set}$ signal of a waveform 198 of FIG. 10 from the control or pulse source 100 of FIG. 6 develops the $\phi_{set}$ signal to close gates 82 and 84 FIG. 6 and establish the reference charge on the electrodes from the $-10$ volts DC source 78 through the positive and negative output leads 64 and 66. This reference charge establishes a predetermined voltage in all electrodes so that a reliable and constant readout value can be obtained. At some appropriate time between adjacent $\phi_{set}$ pulses of the waveform 198, the output voltages are monitored or sampled by the sample pulse $\phi_{SH}$ of a waveform 200 applied to the sample and hold circuit 17 (FIG. 6) to provide a representation of the sample signal during that clock period. The volage of the waveform 206 shows the filter output without the sample and hold function and having the clock pick up excursion. The sampling occurs after the clock pulses of the waveform 190. The filter output signal after the sample and hold function and the differential amplifier (when utilized) is shown by a waveform 207 having amplitude variations as a function of the input signal and the filter characteristic. It is to be noted that a characteristic of a transversal filter is that a plurality of frequency relations may be provided in accordance with the split electrode weighting concept which requires only that the configuration of the split electrodes along the length of the charge coupled device be selected to provide the desired frequency response characteristics.

Figure 11:
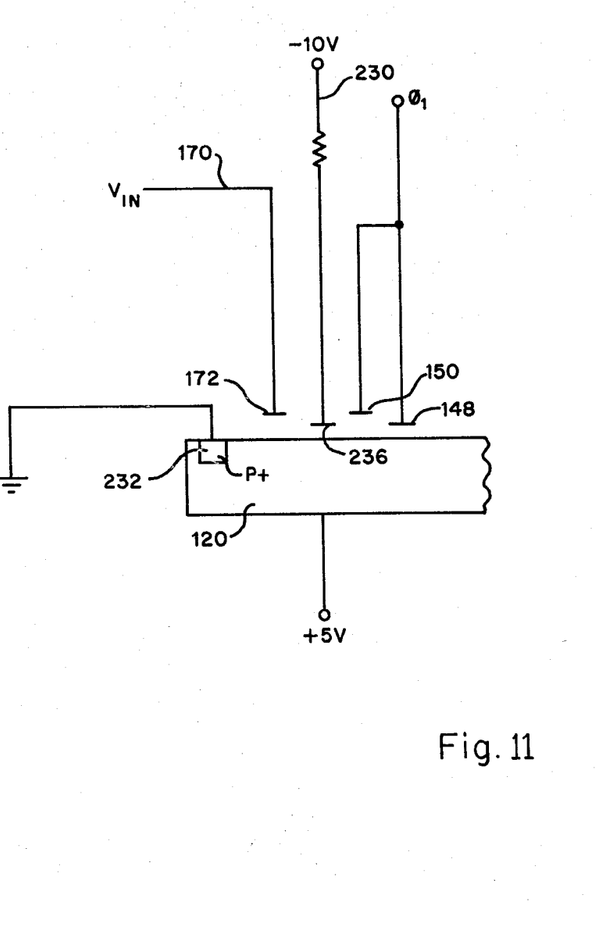
FIG. 11 is a schematic side view showing an illustrative input arrangement that may be utilized in the transversal filter system of FIG. 6.

Referring now to FIG. 11, an input structure that may be utilized in the system of the invention will be further explained. It is to be understood that this is just one illustrated arrangement and that any suitable input configuration may be utilized in the transversal filter in accordance with the invention. The signal $V_{in}$ is applied on the lead 170 to the electrode 172 and a $-10$ volt bias voltage is applied on a lead 230 to an electrode 236. An input diffusion region 232 is biased to ground in the illustrated arrangement and the N type substrate 120 is biased to a positive voltage of about $+5$ volts to establish a reverse bias to the diffusion.

The input sampling occurs at electrodes as 148 and 150 in response to the $\phi_1$ clock pulse.

In operation, the diffusion region 232 is capable of supplying charges to the CCD according to the potential conditions under the electrodes 172 and 236. The charge is then stored in the potential well under the gate 236 and the charge in this potential well is unidirectionally transported to the adjacent potential well during each clock period. Thus upon application of a signal voltage to the lead 170 the current is drawn from the P+ diffusion region 232 and passes along to a subsequent electrode in response to each $\phi_1$ clock pulse.

Figure 12:
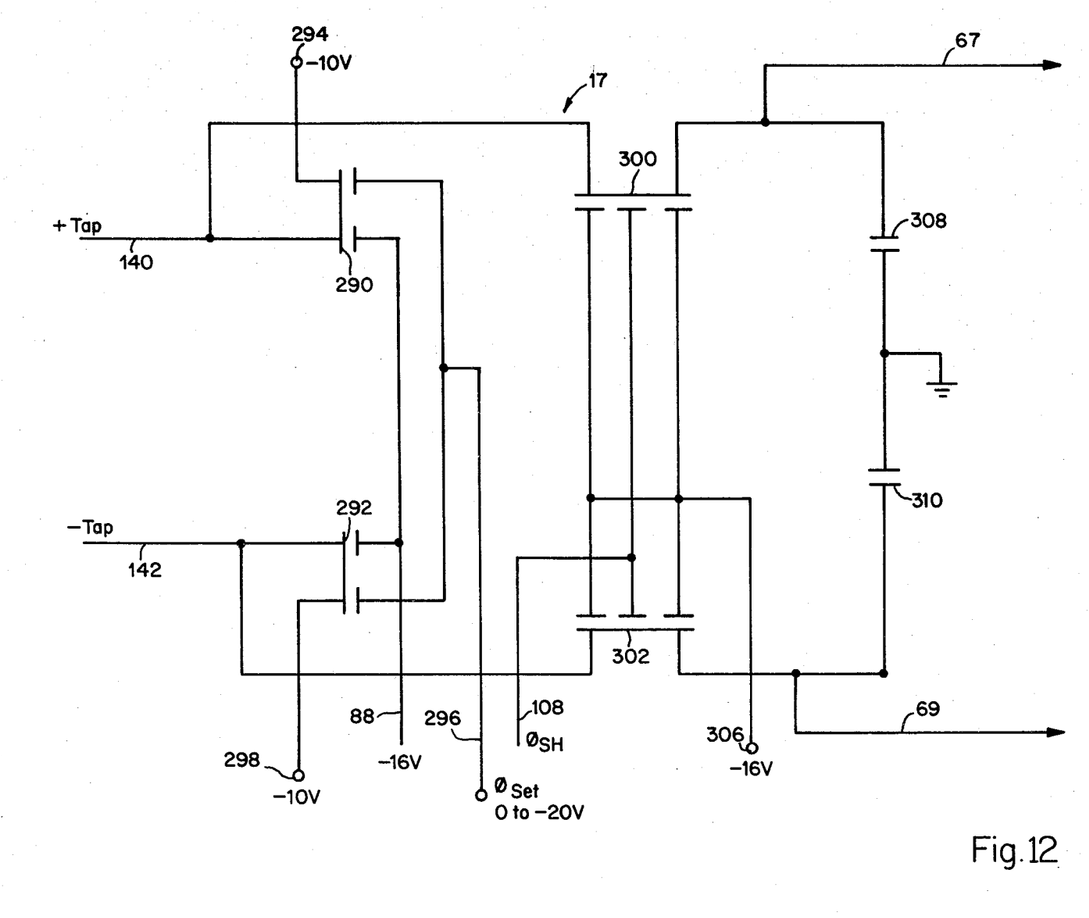
FIG. 12 is a schematic circuit diagram of a sample and hold circuit that may be utilized in the system in accordance with the invention.

Referring now to FIG. 12 the sample and hold circuit 17 of FIG. 6 includes MOSFET tetrodes 290 and 292 forming reset switches with the tetrode 290 having a source electrode coupled to the positive lead 140 and a drain electrode coupled to a terminal 294 for receiving a $-10$ volt potential. A first control gate of the tetrode 290 is coupled to a first control gate of the tetrode 292 and to a terminal 296 supplying a $-12$ volt potential. The second control gates of the tetrodes 290 and 292 are coupled to the lead 88 for receiving the $\phi_{set}$ pulse. The tetrode 292 has a source electrode coupled to the negative lead 142 and a drain electrode coupled to a terminal 298 supplying a $-10$ volt potential.

The sample and hold function is performed by MOSFET pentodes 300 and 302 and capacitors 308 and 310 in a configuration that has been developed by others but has not been applied to a CCD transversal filter in the filter system configuration in accordance with the invention, to further eliminate clock pickup ahead of the differential amplifier to decrease the bandwidth and power requirements of the differential amplifier.

The pentodes 300 and 302 have drain electrodes coupled to respective leads 140 and 142 and second drain electrodes respectively coupled to leads 67 and 69. Two isolation gates of each of the pentodes 300 and 302 are coupled to a $-16$ volt terminal 306 for isolating the control gate from both drains and the control gate is coupled to the lead 108 for receiving the $\phi_{SH}$ pulse. The output terminals of the pentodes 300 and 302 are respectively coupled to first sides of the capacitors 308 and 310 having their opposite sides coupled to ground, for providing the storage function after each sample pulse.

The leads 67 and 69 pass to a high impedance input in the differential amplifier.

Referring now principally to FIG. 8, the fabrication may be performed utilizing known silicon processing technology. The following sequence is given only as an illustration of the processing steps and it is to be understood that other techniques and steps may be utilized within the scope of the invention.

(1) An n-type silicon substrate block is selected with a 2-3 ohm centimeter resistivity.
(2) Oxide is grown on one side of the silicon substrate to a thickness of 1 micrometer.
(3) A mask and a photo-resist process is utilized to form holes through which n+ dopant is diffused for channel stops.

(4) Windows are opened by photo-resist process into which p+ dopant is injected to form diffusion regions such as 304, 310 and 312.

(5) The oxide mask is used to strip all oxide out of regions where 1000 angstroms of $SiO_2$ is to be grown.

(6) The thin oxide 222 is grown on the surface of the silicon.

(7) Polysilicon is deposited 5000 angstrom thick over entire surface of the thin oxide.

(8) The polysilicon is etched with a mask to form the buried polysilicon electrodes.

(9) The polysilicon is oxidized to 1500 angstroms to form a passivation layer. The regions between the polysilicon to be covered by aluminum electrodes have a thicker oxide growth of 2000 angstroms.

(10) Contact holes are formed by masking and etching through the polysilicon over regions to be contacted by an aluminum layer such as openings to the input and output p+ regions, and openings for contacts to polysilicon strips for forming conductors or leads if they are used.

(11) Aluminum is deposited over entire surface to 10,000 angstrom thickness, for example.

(12) The aluminum is etched with a suitable mask to form the aluminum electrodes, the connections to the electrode and regions, connections to buried polysilicon electrodes as well as any leads that are to be formed. It is to be noted that the channel such as 310 (FIG. 10) along the length of the aluminum electrode results from the aluminum deposition in step 10 between the etched polysilicon strips. These masking and etching techniques are well known in the art and do not need to be explained in further detail.

Thus there has been provided a one-sided CCD transversal filter with only one end of each of the split electrodes connected to the output leads, the other end of each of the split electrodes being connected to a bias supply or to a bias supply through another $\phi_{set}$ switch, for uniformity. When some of the weighting coefficients defining a desired impulse response are of a second polarity such as negative, selected ones of the electrodes are connected to the inverting input of the differential amplifier. It is to be noted that the scope of the invention includes one-sided CCD filters with all of the weighting coefficients being of one polarity or with some of the weighting coefficients being of opposite polarity, and with the one end of each of the split electrodes coupled to suitable signal combining means. The net signal in terms of charge is substantially the same as in the prior art device but the electrode area contributing noise is substantially less. Also because the total electrode capacitance is considerably reduced the one-sided filter of the invention has been found to provide a substantial increase in output voltage swing due to the combined induced charge from the displacement currents through each electrode. Thus a substantially large voltage is applied to the differential amplifier resulting in requiring less gain following the differential amplifier and, further, reducing the relative effect of the input device noise of the differential amplifier. The common mode rejection required of the output differential amplifier to provide an output similar to the prior art arrangement is also significantly reduced by the elimination of common mode signal. The length of an active electrode portion is the weighting coefficient normalized to the longest electrode portion. In order to obtain the same net signal the prior art filter has a total electrode width of 2 W and the one-sided filter of the invention only requires a width W. Any threshold voltage variations resulting from process temperature variations are thus also reduced with a width W in the filter of the invention.

What is claimed is:

1. A CCD transversal filter comprising:
   a substrate having first and second ends,
   a plurality of weighting electrodes positioned along said substrate between the first and second ends, each electrode split into first and second portions, said electrodes having a split configuration to provide a selected filter characteristic,
   a constant voltage bias source coupled to the first portion of each of said split electrodes,
   first and second output leads selectively coupled to the second portion of each of said split electrodes, and
   a differential amplifier coupled to said first and second output leads.

2. The combination of claim 1 further including electrode means adjacent to each split electrode for transferring charges between split electrodes and clock means coupled to said electrode means for controlling the transfer of charges between adjacent split electrodes.

3. The combination of claim 1 further comprising sample and hold means including first and second pentodes having first terminals respectively coupled to said first and second output leads and having second terminals coupled to said differential amplifier means.

4. The combination of claim 2 further including reset means coupled to said first and second output leads.

5. A charge coupled transversal filter for providing a desired impulse response having a first and second polarity comprising
   a substrate,
   a plurality of split weighting electrodes positioned along said substrate adjacent to each other, each split electrode having an insulating gap between first and second portions thereof, said gaps having a configuration of said impulse response with the split electrodes representative of the first polarity response having an inverted configuration and the electrodes representative of the second polarity having a noninverted configuration,
   a source of reference potential coupled to the first portions of said split electrodes,
   first and second output leads respectively coupled to the second portions of said inverted and noninverted split electrodes, and
   combining means coupled to said first and second output leads for inverting the signal received from said split electrodes having the inverted configuration.

6. A charge coupled transversal filter for providing a selected impulse response having first and second polarity portions, said impulse response being defined by a plurality of weighting coefficients of first and second polarities, comprising
   a substrate,
   a plurality of weighting electrodes positioned adjacent to each other and along said substrate, each weighting electrode having first and second portions split with an insulating gap, each of said second portions having a length proportional to one of said weighting coefficients, said electrodes corresponding to coefficients of a second polarity having gaps forming an inverted configuration of said impulse response, reference means coupled to the first portions of said split electrodes, first and second leads coupled to the second portions representing respective first and second polarity weighting coefficients, for respectively forming the first and second polarity portions of said impulse response, and combining means coupled to said first and second leads for inverting the signal on said second lead.

7. A CCD transversal filter having a selected impulse response formable from a plurality of first and second polarity weighting coefficients comprising a substrate, a plurality of split weighting electrodes positioned on said substrate for each providing a first plurality weighting coefficient of the selected impulse response, each split electrode having first and second ends, a source of a reference potential coupled to the first ends of said split electrodes, a first output lead coupled to the second ends of the weighting electrodes corresponding to the first polarity weighting coefficients of said impulse response, a second output lead coupled to the second ends of the weighting electrodes corresponding to the second polarity weighting coefficients of said impulse response, and combining means coupled to the first and second output leads for inverting the signal in said second lead and combining with the signals on said first output lead.

8. The combination of claim 7 further including a source of clock pulses and means positioned at each split weighting electrode and coupled to said source of clock pulses for transferring charges between split weighting electrodes.

9. The combination of claim 8 further including switching means coupled to said first and second output leads for establishing a reference voltage on said split electrodes between said clock pulses.

10. A CCD transversal filter operable to develop a selected impulse response from a plurality of predetermined weighting coefficients being of both first and second polarities comprising a plurality of split weighting electrodes each having a portion with an upper width and a portion with a lower width, said lower width of each weighting electrode defining a weighting coefficient of a first polarity, a group of transfer electrodes positioned adjacent to each split electrode, clock means coupled to each group of transfer electrodes for transferring charges between said split electrodes, reference means coupled to the portion of said split weighting electrodes with an upper width, first and second output leads respectively coupled to the portion of said split electrodes with a lower width representing a weighting coefficient with said first polarity and coupled to the portion of said split electrodes with a lower width representing a weighting coefficient with said second polarity, and combining means having inverting and noninverting inputs respectively coupled to said first and second output leads.

11. A CCD transversal filter to provide a selected impulse response to input charges and defined by a plurality of time sequential weighting coefficients being both positive and negative comprising a substrate, a plurality of split electrodes positioned along said substrate and having first and second portions, said second portions each having a surface area representative of a weighting coefficient, said second portions of said plurality of split electrodes having surface areas selected along said substrate to provide said time sequential weighting coefficients, a source of reference potential coupled to the first portions of said split electrodes, first and second output conductors respectively coupled to the second portions of said split electrodes corresponding to the weighting coefficients of the first polarity and coupled to the second portions of said split electrodes corresponding to the weighting coefficients of the second polarity, and combining means having an inverting and a noninverting input terminal respectively coupled to said first and second output conductors.

12. The combination of claim 11 further including clock means, transfer electrode means adjacent to each split electrode and coupled to said clock means for transferring stored charges therebetween, and reset means coupled to said first and second output conductors for establishing reference charges on said split conductors.

13. A CCD transversal filter having a characteristic to provide a selected impulse response defined by a plurality of weighting coefficients comprising:

a substrate having first and second ends, a plurality of split weighting electrodes positioned along said substrate between said first and second ends, said split weighting electrodes each having a gap between first and second portions to provide one of said weighting coefficients as a function of the length of said second portion, a reference potential coupled to the first portion of each of said split weighting electrodes, signal combining means coupled to the second portion of each of said split weighting electrodes, and sample and hold means including first and second pentodes coupled between the second portions of said split weighting electrodes and said means for coupling all of said second portions.

14. A CCD transversal filter comprising:

a substrate having first and second ends;

a plurality of weighting electrodes positioned along said substrate between the first and second ends, each of said weighting electrodes split into first and second portions, said weighting electrodes having the split configuration to provide a selected filter characteristic;

a constant voltage bias source coupled to a first portion of each of said split electrodes;

a plurality of output leads selectively coupled to the second portion of each of said split electrodes; and combining means coupled to said plurality of output leads.

* * * * *